US009341679B2

(12) United States Patent
Miyamoto

(10) Patent No.: US 9,341,679 B2
(45) Date of Patent: *May 17, 2016

(54) BATTERY VOLTAGE MONITORING APPARATUS

(71) Applicant: Renesas Electronics Corporation, Kanagawa (JP)

(72) Inventor: Manabu Miyamoto, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 664 days.

This patent is subject to a terminal disclaimer.

(21) Appl. No.: 13/675,567

(22) Filed: Nov. 13, 2012

(65) Prior Publication Data

US 2013/0106428 A1  May 2, 2013

Related U.S. Application Data

(63) Continuation of application No. 12/007,028, filed on Jan. 4, 2008, now Pat. No. 8,330,469.

(30) Foreign Application Priority Data

Jan. 5, 2007  (JP) ................. 2007-000411

(51) Int. Cl.
G01R 31/36 (2006.01)
G01R 15/04 (2006.01)
G01R 19/165 (2006.01)

(52) U.S. Cl.
CPC .............. *G01R 31/362* (2013.01); *G01R 15/04* (2013.01); *G01R 31/3658* (2013.01); *G01R 19/16542* (2013.01); *G01R 31/3648* (2013.01)

(58) Field of Classification Search
CPC ........... G01R 19/16542; G01R 19/165; G01R 15/12; G01R 31/3658

USPC ................................................. 324/429, 433
See application file for complete search history.

(56) References Cited

U.S. PATENT DOCUMENTS 5,547,775 A   8/1996  Eguchi et al.
5,578,914 A   11/1996  Morita
(Continued)

FOREIGN PATENT DOCUMENTS

JP    10-224981   8/1998
JP    11-355904   12/1999
(Continued)

OTHER PUBLICATIONS

United States Office Action dated Jul. 11, 2011 in U.S. Appl. No. 12/007,028.
(Continued)

*Primary Examiner* — Edward Tso
*Assistant Examiner* — Johali Torres Ruiz
(74) *Attorney, Agent, or Firm* — McGinn IP Law Group, PLLC

(57) ABSTRACT

A battery voltage monitoring apparatus for monitoring an assembled battery voltage, the assembled battery including a plurality of battery cells, the battery voltage monitoring apparatus including a plurality of input terminals, the plurality of input terminals being respectively coupled to the plurality of battery cells through a potential measurement line, a comparator having a hysteresis characteristic and including a first terminal and a second terminal, the second terminal receiving a reference voltage, and a current source, one end of the current source being coupled between one of the plurality of the input terminals and the first terminal.

11 Claims, 12 Drawing Sheets

(56) References Cited

U.S. PATENT DOCUMENTS

| | | | |
|---|---|---|---|
| 5,959,437 A | 9/1999 | Hamaguchi | |
| 6,094,031 A | 7/2000 | Shimane et al. | |
| 6,194,869 B1 * | 2/2001 | Peterzell | 320/134 |
| 6,255,826 B1 | 7/2001 | Ohsawa et al. | |
| 8,330,469 B2 * | 12/2012 | Miyamoto | 324/433 |
| 2005/0127873 A1 | 6/2005 | Yamamoto et al. | |
| 2005/0242780 A1 | 11/2005 | Sakuma et al. | |
| 2006/0220461 A1 | 10/2006 | Miyamoto | |

FOREIGN PATENT DOCUMENTS

| | | |
|---|---|---|
| JP | 2001-116776 | 4/2001 |
| JP | 2002-101565 | 4/2002 |
| JP | 2003-111284 | 4/2003 |
| JP | 2003-208927 | 7/2003 |
| JP | 2005-117780 | 4/2005 |
| JP | 2006-275928 | 10/2006 |

OTHER PUBLICATIONS

United States Office Action dated Oct. 1, 2010 in U.S. Appl. No. 12/007,028.

Japanese Action dated May 24, 2011 with English Language Translation.

* cited by examiner

BATTERY VOLTAGE MONITORING APPARATUS

INCORPORATION BY REFERENCE

This present application is a Continuation Application of U.S. patent application Ser. No. 12/007,028, filed on Jan. 4, 2008, based upon and claims the benefit of priority from Japanese patent application No. 2007-000411, filed on Jan. 5, 2007, the disclosure of which is incorporated herein in its entirety by reference.

BACKGROUND OF THE INVENTION

1. Field of the Invention

This invention relates to a battery voltage monitoring apparatus for detecting battery voltage of a power supply apparatus. The battery voltage monitoring apparatus includes a plurality of secondary batteries connected in series. Particularly, this invention relates to a battery voltage monitoring apparatus for detecting disconnection of a single line which is used for potential measurement.

2. Description of Related Art

An electric vehicle and hybrid vehicle are known as an eco-friendly one. In the electric vehicle and hybrid vehicle, a motor is used as driving force. Rechargeable secondary batteries are connected to the motor as electric power source. A direct current supplied from the secondary battery is converted into an alternating current, and the motor is driven by the alternating current. High voltage is required to drive the motor. Generally, the secondary battery is formed as an assembled battery including a plurality of battery cells connected in series.

A plurality of voltage sensors are used for detecting each battery cell voltage in the assembled battery. A moderate number of voltage sensors are assembled and modularized. When a large number of battery cells are connected in series such as the electric vehicle or the like, a large number of voltage sensors are also provided and connected in series. An apparatus monitoring assembled battery voltage like this is shown in Japanese Unexamined Patent Application Publication Nos. 2003-208927, 2003-111284, and 2005-117780.

An apparatus for monitoring potentials of the assembled batteries is described hereinafter in detail. In the apparatus, a module including a plurality of voltage sensors is configured as one semiconductor device (IC). A plurality of semiconductor devices are connected in series. Each semiconductor device (IC) has the plurality of battery sensors.

FIG. 11 shows a schematic view of the conventional voltage monitoring apparatus. As shown in FIG. 11, one IC is able to detect voltages of four battery cells. Each input terminal of IC is connected to a battery cell C101-C108 through lines for voltage measurement L101-L109. The IC 101 in FIG. 11 operates with a positive terminal (a node N101) of the battery cell C101 as a power supply potential and a negative terminal of the battery cell C104 (a positive terminal of battery cell C105, a node N102) as ground potential. An IC 102 is connected to the IC 101 in series. Hence, the IC 102 operates with a positive terminal (a node N102) of battery cell C105 as power supply potential, and a negative terminal (a node N103) of battery cell C108 as ground potential. When each IC detects that the monitored battery cell becomes excess voltage or low voltage, the IC outputs an excess voltage detect signal or low voltage detect signal.

Taking IC 102 of FIG. 11 for instance, the operation of a voltage sensor module outputting the excess voltage detect signal or low voltage detect signal is explained. FIG. 12 shows a configuration of conventional IC 102 in FIG. 11. As shown in FIG. 12, the voltage sensor module comprises a plurality of voltage sensors SEN101-SEN104 and output logic circuits LOG101 and LOG102. When each voltage sensor SEN101-SEN104 detects excess voltage or low voltage of the battery cell to be monitored, the voltage sensor outputs high level signal as the excess voltage detect signal or low voltage detect signal, for example. When any voltage sensor outputs the excess voltage detect signal or low voltage detect signal, output of OR circuit of output logical circuit LOG101 turns into high level from low level, for example. With this operation, the IC 102 outputs the excess voltage detect signal or low voltage detect signal. When any voltage sensor detects low voltage, the output logic circuit LOG101 outputs high level, for example. When any voltage sensor detects excess voltage, the output logic circuit LOG102 outputs low level, for example.

For the apparatus monitoring the assembled battery voltage with the plurality of series-connected ICs, the apparatus monitoring the assembled battery voltage can be configured as follows. When a line connecting the battery cells and the voltage monitoring apparatus is disconnected, the voltage sensor connected to the disconnected line monitors abnormal potential to detect disconnection. For example, this configuration is shown in our Japanese Unexamined Patent Application Publication No. 2006-275928. However, for example, when the line corresponding to a connect portion between ICs like L105 in FIG. 11 is disconnected, there are problems as follows.

When disconnection happens to the line L105 in FIG. 11, voltage supply from the battery cell is not supplied to a node N104 in FIGS. 11 and 12. Hence, current flowing out from VSS101 of IC101 flows into a VCC102 and V105 of IC 102. If the circuit is configured so that the uppermost voltage sensor SEN101 detects a defect of excess voltage for detecting disconnection, potential of the node N104 rises at disconnecting of the L105. The voltage sensor SEN101 detects excess voltage and logic output of output logic circuit LOG102 is inverted. At this time, in logic circuit LOG 102, leak current flows between VCC102 as voltage supply of IC102 and VSS102. When leak current flows, power supply potential VCC102 becomes fall and potential of node N104 becomes lower. When potential of node N104 becomes lower, the voltage sensor SEN101 does not detect excess voltage. Hence, output potential becomes lower. When output potential of voltage sensor SEN101 becomes lower than threshold of logic circuit LOG102, output logic circuit LOG102 outputs low level again. Hence, IC102 does not output excess voltage detect signal. As a result, disconnection cannot be detected. In some cases, after that, the operation is repeated, that excess voltage is detected because leak current is decrease. Then, there is the case in which output of the IC102 maybe switched between high level and low level.

As described above, because of disconnection of lines, a detect signal of voltage sensor module is output incorrectly. Hence, there is a case, for battery voltage monitoring apparatus, output becomes unstable.

SUMMARY

In one embodiment, there is provided a battery voltage monitoring apparatus monitoring an assembled battery voltage, the assembled battery including a plurality of battery cells, includes; a voltage sensor detecting potential of the plurality of battery cells; an output logic circuit outputting a potential detect signal based on an output of voltage sensor, the potential detect signal representing that abnormal potential is detected; and a delay circuit adding certain delay to the output of the voltage sensor and outputting the delayed voltage detect signal to the output logic circuit; in which, the voltage sensor includes at least one comparator having hysteresis characteristic, and detects the potential of the battery cell based on an output of the comparator.

In another embodiment, there is provided a battery voltage monitoring apparatus monitoring an assembled battery voltage, the assembled battery including a plurality of battery cells, includes; a voltage sensor detecting potential of the plurality of battery cells; an output logic circuit outputting a potential detect signal based on an output of voltage sensor, the potential detect signal representing that abnormal potential is detected; and a delay circuit adding certain delay to the output of the voltage sensor and outputting the delayed voltage detect signal to the output logic circuit; in which, the voltage sensor includes a comparator operating with output potential of battery cell as potential source, the battery cell being an object to be monitored, and the comparator has hysteresis characteristic.

In still another embodiment, there is provided a battery voltage monitoring apparatus monitoring an assembled battery voltage, the assembled battery including a plurality of battery cells, includes; a comparator detecting potential of the battery cell, and outputting a potential signal representing results of detection based on certain hysteresis characteristic; a delay circuit adding certain delay to the potential signal; and a logic circuit outputting a potential detect signal based on an output of the delay circuit.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
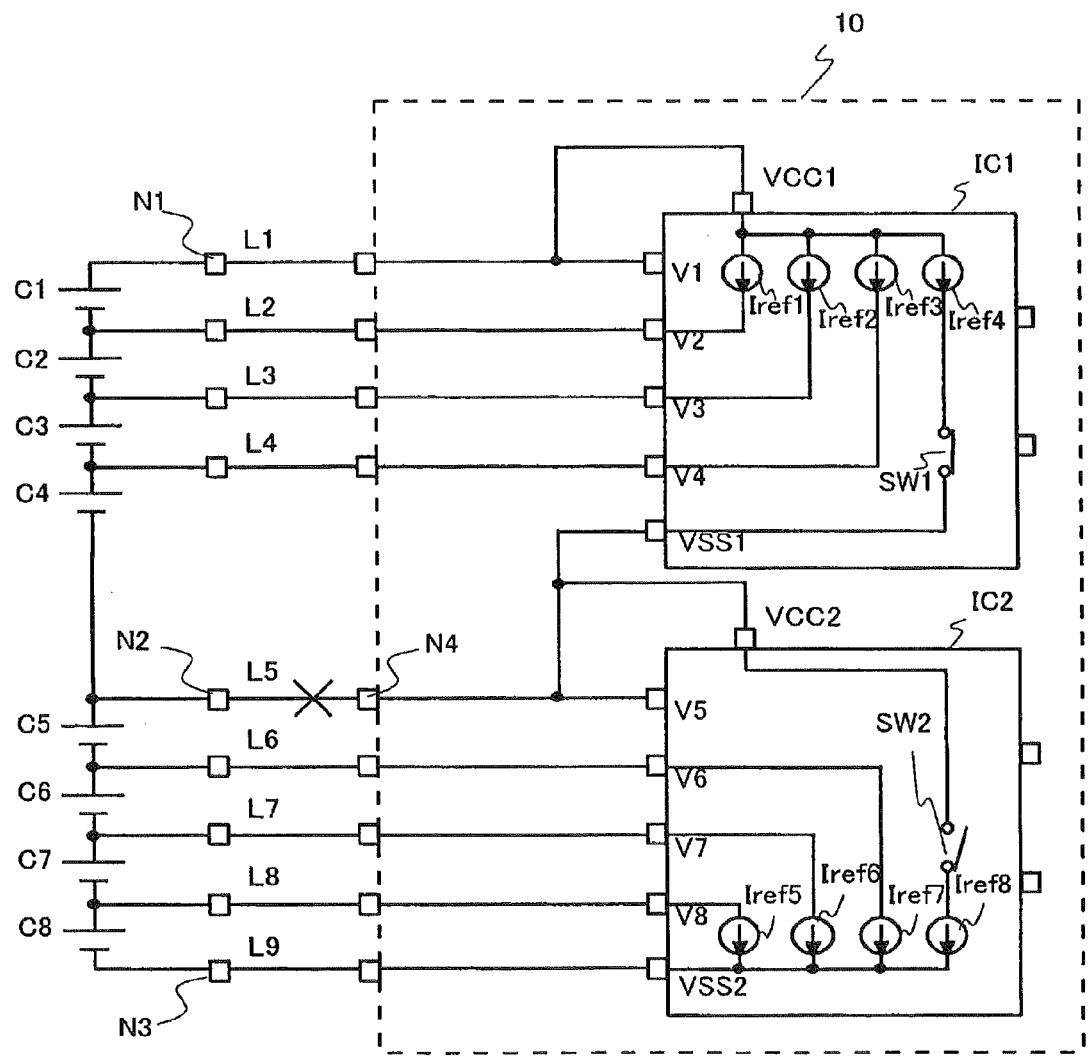
FIG. 1 is a schematic diagram of a voltage monitoring apparatus comprising function of detecting disconnection.

Hereinafter, embodiments of this invention are described with drawings. FIG. 1 shows a schematic diagram for explaining a voltage monitoring apparatus 10 according to the first embodiment of the invention. The voltage monitoring apparatus 10 of this embodiment includes a plurality of voltage sensor modules. Here, the voltage sensor module is defined as an electrical element including one or more voltage sensors. In this embodiment, one module is configured as one semiconductor device (IC). FIG. 1 shows an instance of the voltage monitoring apparatus 10 including two voltage sensor modules IC1 and IC2. Hereinafter, the voltage sensor module is also called IC. Hereinafter, with taking a case in which one IC detects four battery cell voltages as an example, a first embodiment will be described.

As FIG. 1 shows, in this embodiment, eight battery cells C1-C8, which are objects to be monitored by the voltage monitoring apparatus, are connected in series. The IC1 operates on the condition that a positive terminal potential of battery cell C1 (see a node N1 in FIG. 1) is a first source potential (a higher source potential) and a positive terminal potential of battery cell C5 (see a node N2 in FIG. 1) is a second source potential (a lower source potential). Because the IC2 is connected to the IC1 in series, the IC2 operates on the condition that a positive terminal potential of battery cell C5 (see a node N2 in FIG. 1) is a first source potential and a negative terminal potential of battery cell C8 (see a node N3 in FIG. 1) is a second source potential (a ground potential).

Each positive terminal of battery cells is connected to input terminals V1-V8 of IC through each line L1-L8. As shown in FIG. 1, the input terminals V1-V4 are input terminals of IC1, and the input terminals V5-V8 are input terminals of IC2. As described above, the IC1 operates on the condition that the positive terminal potential of battery cell C1 is the first source potential. Hence, the positive terminal of battery cell C1 is also connected to a first source terminal VCC1 of battery cell IC1 through line L1. In other words, the line L1 also functions as a source line for the voltage sensor module IC1. As the positive terminal potential of battery cell C5 is the second source potential for IC1 and the first source potential for IC2, the positive terminal of battery cell C5 is connected to a second source terminal VSS1 of IC1, the first source terminal VCC2 of IC2, and the input terminal V5 of IC2 through line L5. That is, the line L5 functions as a source line for IC1 and IC2. A negative terminal of battery cell C8 is connected to a second source terminal VSS2 of IC2 through a source line L9.

Figure 2:
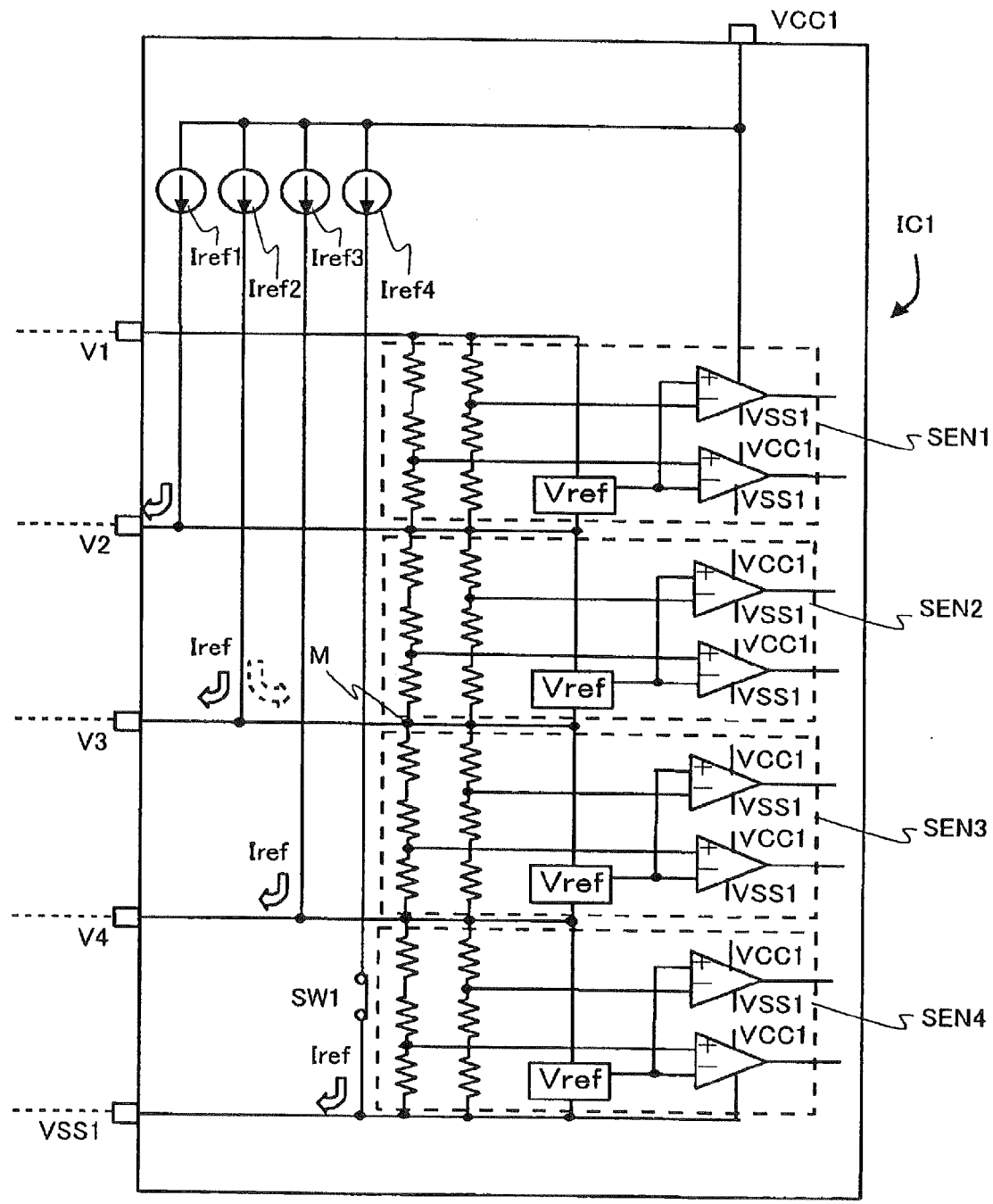
FIG. 2 is a circuit diagram of the voltage monitoring apparatus comprising function of detecting disconnection.

FIG. 1 shows the voltage monitoring apparatus comprising a function for detecting disconnection for example. The voltage monitoring apparatus in FIG. 1 is based on our earlier Patent Application Publication No. 2006-275928. Firstly, with reference to FIG. 1 and FIG. 2, the IC comprising the function of detecting disconnection in the earlier publication will be described briefly. FIG. 2 shows an IC1 based on the earlier publication.

As shown in FIG. 2, the IC of the first embodiment comprises constant current sources Iref1-Iref4 corresponding to the number of the monitored battery cells. The IC also comprises voltage sensors SEN1-SEN4 corresponding to the number of battery cells. Each voltage sensor comprises a voltage divider resistor for excess voltage detection, a voltage divider resistor for low voltage detection, a reference potential circuit, a comparator for excess voltage detection, and a comparator for low voltage detection. An explanation about detailed operation of the voltage sensor is omitted. In the voltage sensors used in this embodiment, there is no or little current change like leak current caused by potential detection.

In the IC1 as shown in FIG. 2, the constant current source Iref1 supplies a constant current Iref from the source terminal VCC1 of IC1 to the input terminal V2 connected to the negative terminal of battery cell C1. The constant current source Iref2 supplies a constant current Iref from the source terminal VCC1 of IC1 to the potential input terminal V3 connected to the negative terminal of battery cell C2. The other constant current sources are sequentially connected in the same way. The constant current source Iref4 supplies a constant current from the first source terminal VCC1 to the second source terminal VSS1. The IC2 comprises constant current sources Iref5-Iref8 as the IC1. But, the constant current sources of IC2 are connected so that current flows from input terminals V6-V8 to the second source terminal VSS2 (see FIG. 1). A switch SW1 (a switch SW2) is provided to a current path between the first source terminal VCC1 of IC1 (the first source terminal VCC2 of IC2) and the second source terminal VSS1 (VSS2). The switch SW1 (the switch SW2) makes current of constant current source Iref4 (Iref8) to selectively flow. As shown in FIG. 1, in this embodiment, the switch SW1 of IC1 is set to be conduction state, and the switch SW2 of IC2 is set to be non-conduction state.

Hereinafter, the IC1 in FIG. 2 is described as an example. During normal operation, current Iref generated by the constant current source flows through the input terminals V2-V4, VSS1, and lines L2-L5 to the negative terminal of battery cell (see an arrow in FIG. 2). That is, in this embodiment, when there is no disconnection in lines L1-L8, current Iref generated by constant current source constantly flows into each input terminal.

When disconnection is caused in the line L3, current, which has flowed from VCC1 to V3, does not flow into the input terminal V3, but it flows into voltage sensor side (see a dashed arrow in FIG. 2). As a result, node potential (see M in FIG. 2) between the voltage sensors rises and the voltage sensor outputs a value which is not detected during normal operation. With this operation, disconnection of lines connected between the battery cells and the voltage monitoring apparatus can be detected.

Hereinafter, the description will be made on the case in which the line L5 is disconnected in the voltage sensor module. As described above, the constant current source Iref4 is provided between the VCC1 and VSS1 of IC1, and the switch SW1 is set to be conduction state. Hence, if the line L5 does not come down, the current Iref generated by Iref4 flows to a negative terminal side of the battery cell C4 through the source terminal VSS1 and L5. On the other hand, when disconnection is caused in the line L5, current which is generated by Iref4 flows toward the input terminal V5 (node N4) and VCC2 of IC2. Therefore, potential of the input terminal V5 rises, and potential between the input terminals V5 and V6 rises. That is, in the voltage monitoring apparatus 10 configured as FIG. 1, when disconnection is caused in the line L5 connected to source potential of voltage sensor module, potential of input terminal V5 becomes increase.

Figure 3:
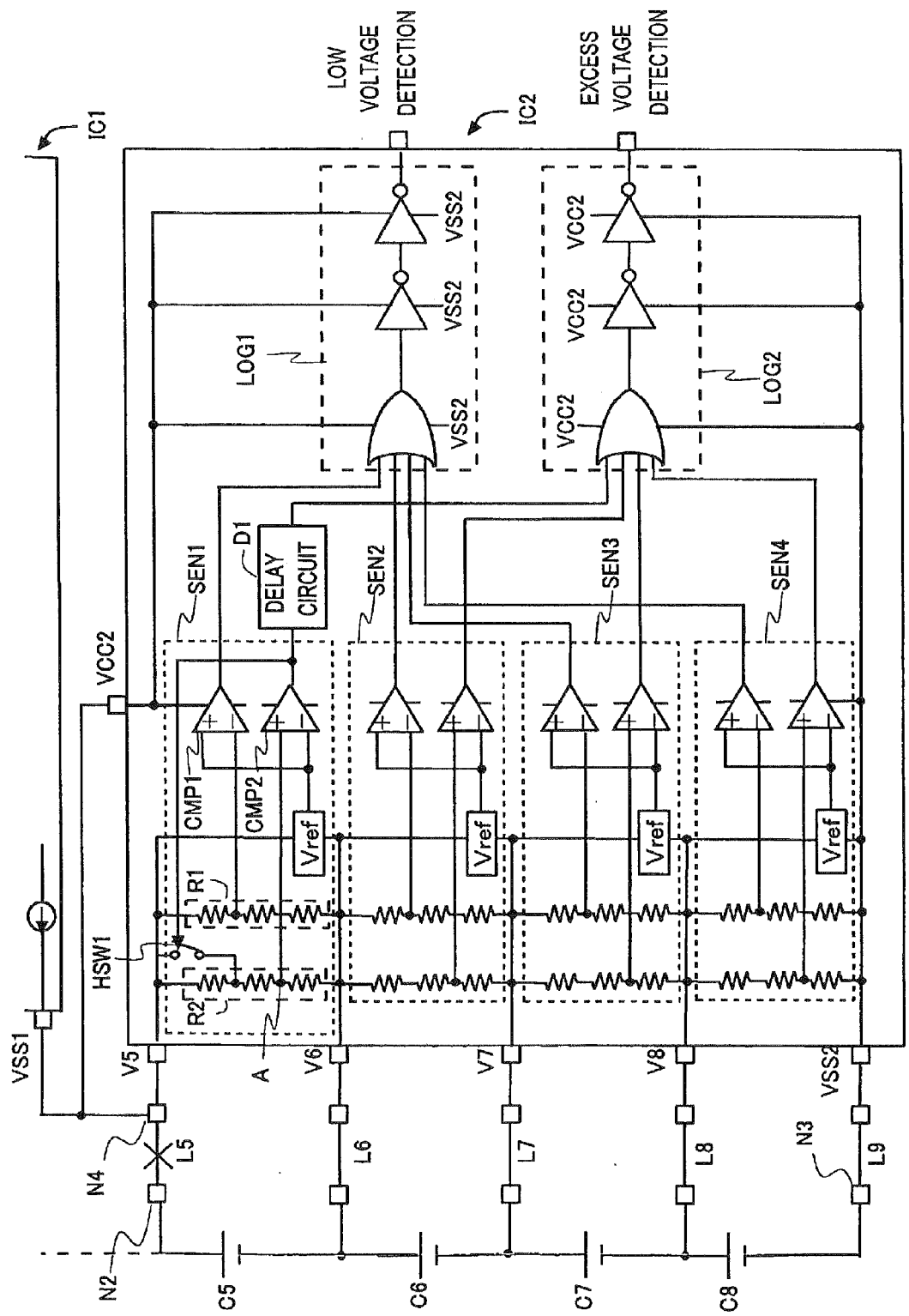
FIG. 3 is a circuit diagram of the voltage monitoring apparatus according to a first embodiment in this invention.

In the voltage monitoring apparatus configured as described above, the voltage sensor module in this embodiment is configured as follows. FIG. 3 shows the voltage sensor module IC2 of the first embodiment of this invention. Hereinafter, in drawings used for explaining the embodiments, if not otherwise specified, the current source for detecting disconnection as described above is omitted. However, the current source for detecting disconnection is actually connected. FIG. 3 shows the case in witch disconnection is caused in the line L5.

As shown in FIG. 3, the voltage sensor module IC2 comprises a plurality of voltage sensors SEN1-SEN4, and output logic circuits LOG1 and LOG2. Each voltage sensor detects excess voltage and low voltage of battery cell, so as to output the excess voltage signal and the low voltage signal. When the lines L5-L9 to connect the battery cells and the voltage sensor modules come down, each voltage sensor also detects abnormal potential and outputs the excess voltage signal and the low voltage signal. Hereinafter, in order to distinguish the excess voltage detect signal from low voltage detect signal output from IC1 and IC2, detect signals output from comparators are simply called as excess voltage signal and a low voltage signal or potential signal. When any voltage sensor outputs the excess voltage signal or the low voltage signal, the output logic circuit LOG1 or LOG2 outputs the excess voltage detect signal or the low voltage detect signal as IC2 based on the voltage signal of the voltage sensor. In this embodiment, the output logic circuit comprises an OR circuit and a plurality of invertors which operate between VCC2 and VSS2.

Each voltage sensor SEN1-SEN4 comprises a voltage divider resistor for low voltage detection R1, a voltage divider resistor for excess voltage detection R2, a reference potential circuit VREF, a comparator for low voltage detection CMP1, and a comparator for excess voltage detection CMP2. The comparator for excess voltage detection CMP2 compares a divided point potential (described as A in FIG. 3) of the voltage divider resistor for excess voltage detection R2 and an output potential Vref of reference potential circuit VREF. When the divided point potential is higher than the output potential Vref, the comparator for excess voltage detection CMP2 outputs the excess voltage signal. In the same way, the comparator for low voltage detection CMP1 compares a potential of the divided point voltage of the voltage divider resistor for low voltage detection R1 and the output potential Vref of the reference potential circuit. When the divided point potential is lower than the output potential Vref, the comparator for low voltage detection CMP1 outputs the low voltage signal. The comparators CMP1 and CMP2 are driven with operation potential between VCC2 and VSS2.

In this embodiment, the voltage sensor SEN1 which is the uppermost voltage sensor of IC2 further comprises a switch for hysteresis HSW1. This switch HSW1 operates based on the output of the comparator for excess voltage detection CMP2. In this embodiment, the switch for hysteresis HSW1 is connected so that a part of resistors between a divided point A and the node N4 is shorted. For example, when the comparator for excess voltage detection outputs high level signal, the switch for hysteresis HSW1 is set to be conduction state. Hence, output of comparator for excess voltage detection CMP2 has hysteresis characteristic. That is, a comparator having hysteresis characteristic is configured with the switch HSW1, the uppermost resistor of resistor R2 and the comparator for excess voltage detection CMP2. A delay circuit D1 is provided between the comparator for excess voltage detection CMP2 of uppermost voltage sensor SEN1 and the output logic circuit LOG2.

Figures 4A, 4B:
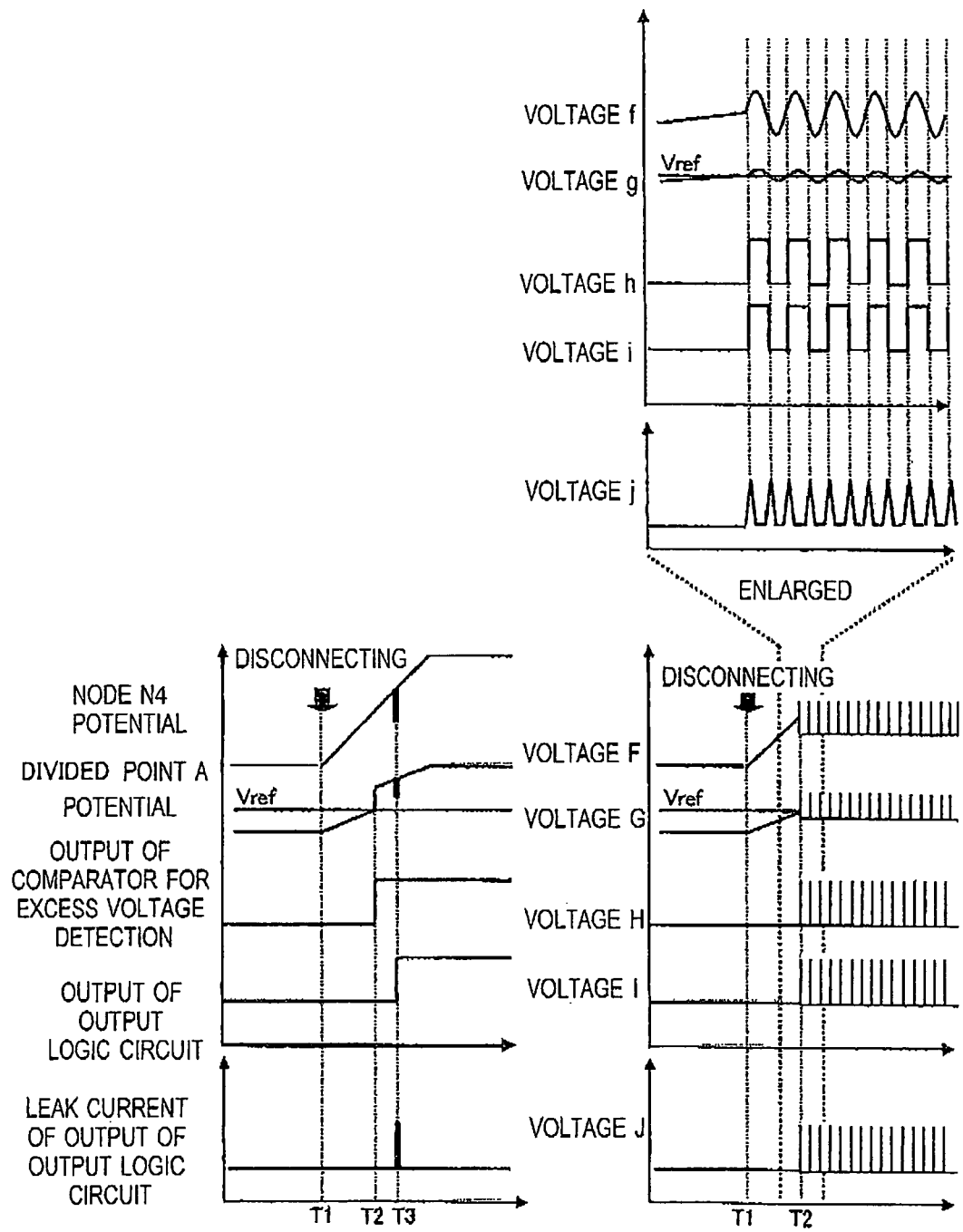
FIG. 4A is a drawing of operation waveform of the voltage monitoring apparatus according to the first embodiment in this invention.
FIG. 4B is a drawing of operation waveform of the voltage monitoring apparatus for reference.

Hereinafter, operations of voltage monitoring apparatus 10 configured described above will be explained. FIG. 4A shows a node N4 potential (terminal V5), a divided point A potential, output of comparator for excess voltage detection CMP2 in the voltage sensor SEN1, output of output logic circuit LOG2 and leak current flowing through the output logic circuit. FIG. 4A shows waveforms of these signals on the condition in which the line L5 is disconnected in this embodiment. FIG. 4B shows waveforms when there is not switch for hysteresis HSW1 and the delay circuit D1 in this embodiment for the sake of comparison. A voltage F in FIG. 4B corresponds to the node N4 potential in FIG. 4A, a voltage G to the divided point A potential, a voltage H to the output of comparator for excess voltage detection, a voltage I to the output of output logic circuit, and a voltage J to the leak current of output of output logic circuit. Each voltage f-j in FIG. 4B shows enlarged portion of the voltage F-J.

It is assumed that the line L5 comes down at the time T1 in FIG. 4A. When disconnection is caused in the line L5 at the time T1, the node N4 potential becomes to increase with the current source Iref4. The divided point A potential rises based on the increase of node N4 potential. Hence, when the divided point A potential is higher than the reference potential Vref at a time T2, output of comparator for excess voltage detection turns high level (see output of comparator for excess voltage detection in FIG. 4A).

Because output of comparator for excess voltage detection is high level, the switch for hysteresis HSW1 becomes conduction state. As part of resistors between the node N4 and the divided point A is shorted by the switch HSW1, the divided point A potential rises (see divided point A potential in FIG. 4A).

Output of comparator for excess voltage detection CMP2 is input to the OR circuit of output logic circuit LOG2 through the delay circuit D1. As the delay circuit D1 is provided between the comparator for excess voltage detection CMP2 of voltage sensor SEN1 and the output logic circuit LOG2, the OR circuit of output logic circuit LOG2 outputs high level at the time T3 (see output of output logic circuit). At the time T3, a certain time is passed from when the comparator for excess voltage detection CMP2 outputs high level.

At this time, leak current flows between VCC2-VSS2 (see leak current of output logic circuit), and the VCC2 potential becomes low. Hence, the node N4 potential connected to the VCC2 becomes low. The divided point A potential becomes low as potential of the node N4 falls. However, in this embodiment, when the comparator for excess voltage detection CMP2 outputs high level at the time T2, the switch for hysteresis HSW1 turns conduction state. This operation sets the divided point A potential increase. Hence, even if leak current flows to the output logic circuit, the divided point A potential does not become Vref or below. Further, change does not occur in the output of comparator for excess voltage detection CMP2 (see divided point A potential and output of output logic circuit in FIG. 4A).

On the other hand, it is assumed that there is no delay circuit D1 as FIG. 4B, the comparator for excess voltage detection CMP2 outputs high level, and almost at the same time, the OR circuit outputs high level. The comparator for excess voltage detection detects excess voltage, and at the same time, leak current flows. As a result, this leak current makes VCC2 low. In this configuration, because of lowering of VCC2 caused by leak current, divided potential becomes Vref or below. Hence, output of comparator for excess voltage detection oscillates and it makes operation unstable. The voltages f-j of FIG. 4B is waveforms around time T2, when output of comparator for excess voltage detection oscillates. As shown in upper portion of chart, in this case, output of comparator for excess voltage detection turns high level and low level repeatedly, because the divided point A potential increases and decreases from reference potential Vref. As a result, operations become unstable.

As described above, in this embodiment, hysteresis characteristic is set for the voltage sensor SEN1 corresponding to a connect portion between ICs. And after the predefined time is passed from when the comparator for excess voltage detection detects excess voltage (after outputting the excess voltage signal), output of output logic circuit is set to be inverted. This operation can prevent the false operation as follows from taking place. The voltage monitoring apparatus can not detect disconnection caused by leak current flowing into output logic circuit LOG2 and unstable output is caused.

Second Embodiment

Figure 5:
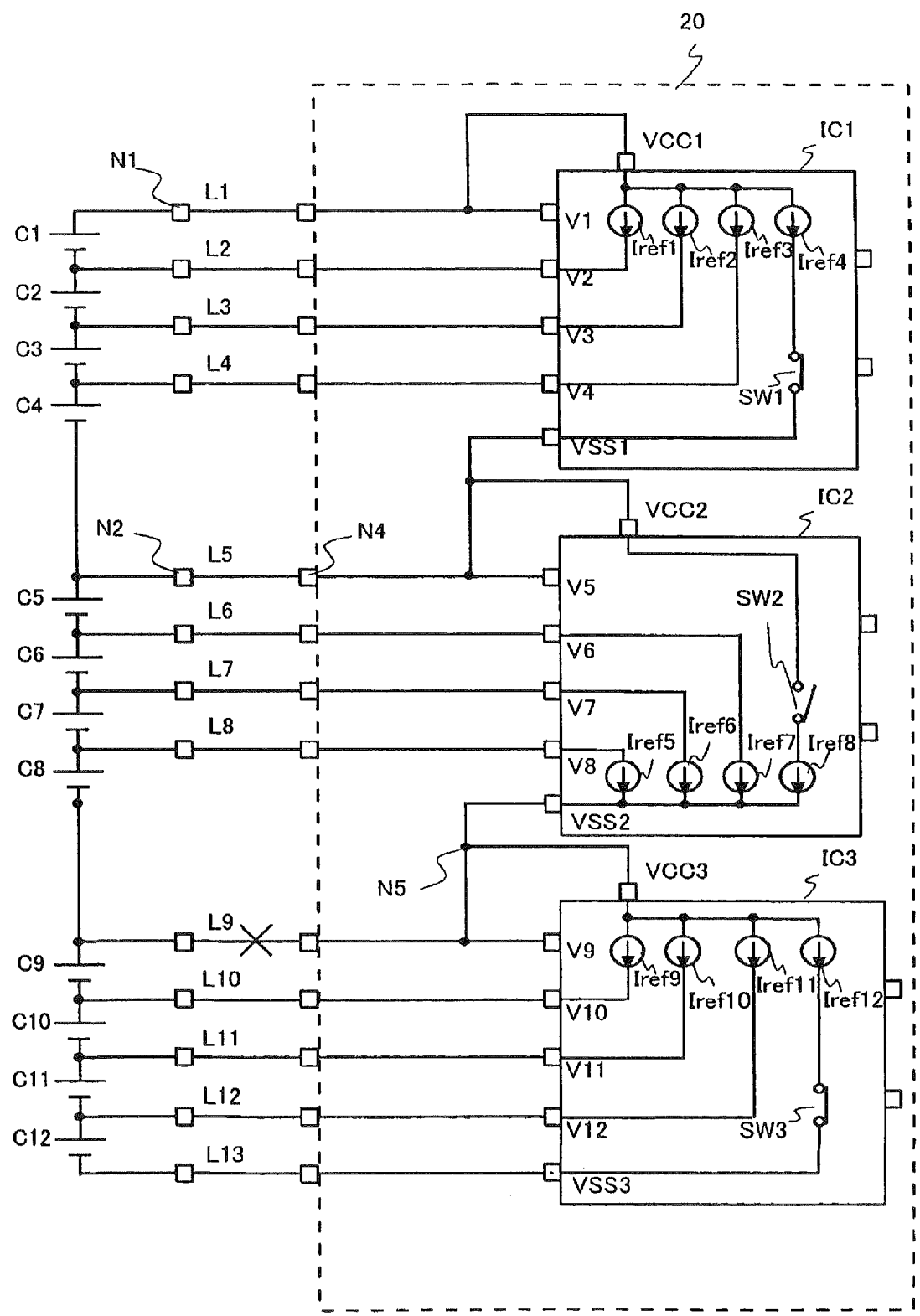
FIG. 5 is a drawing of a voltage monitoring apparatus according to a second embodiment in this invention.

FIG. 5 shows a voltage monitoring apparatus according to a second embodiment in this invention. FIG. 5 shows the voltage monitoring apparatus of second embodiment comprising IC3, which has the same configuration as IC1, connected to the IC2 of FIG. 1 and FIG. 3. Hereinafter, the case will be explained in witch disconnection is caused in a line L9 corresponding to the connect portion between IC2 and IC3 in this voltage monitoring apparatus 20.

When the line L9 comes down, current from positive terminal of battery cell C9 does not flow into current sources Iref9-Iref12 of IC3. When disconnection is caused in the line L9, current from VSS2 terminal (node N5) flows into Iref9-Iref12. Hence, VSS2 terminal potential becomes lower and potential between V8 and VSS2 in IC2 becomes larger. As a result, a voltage sensor connected between V8 and VSS2 of IC2 detects excess voltage and outputs the excess voltage detect signal. This embodiment prevents false operation of IC2.

Figure 6:
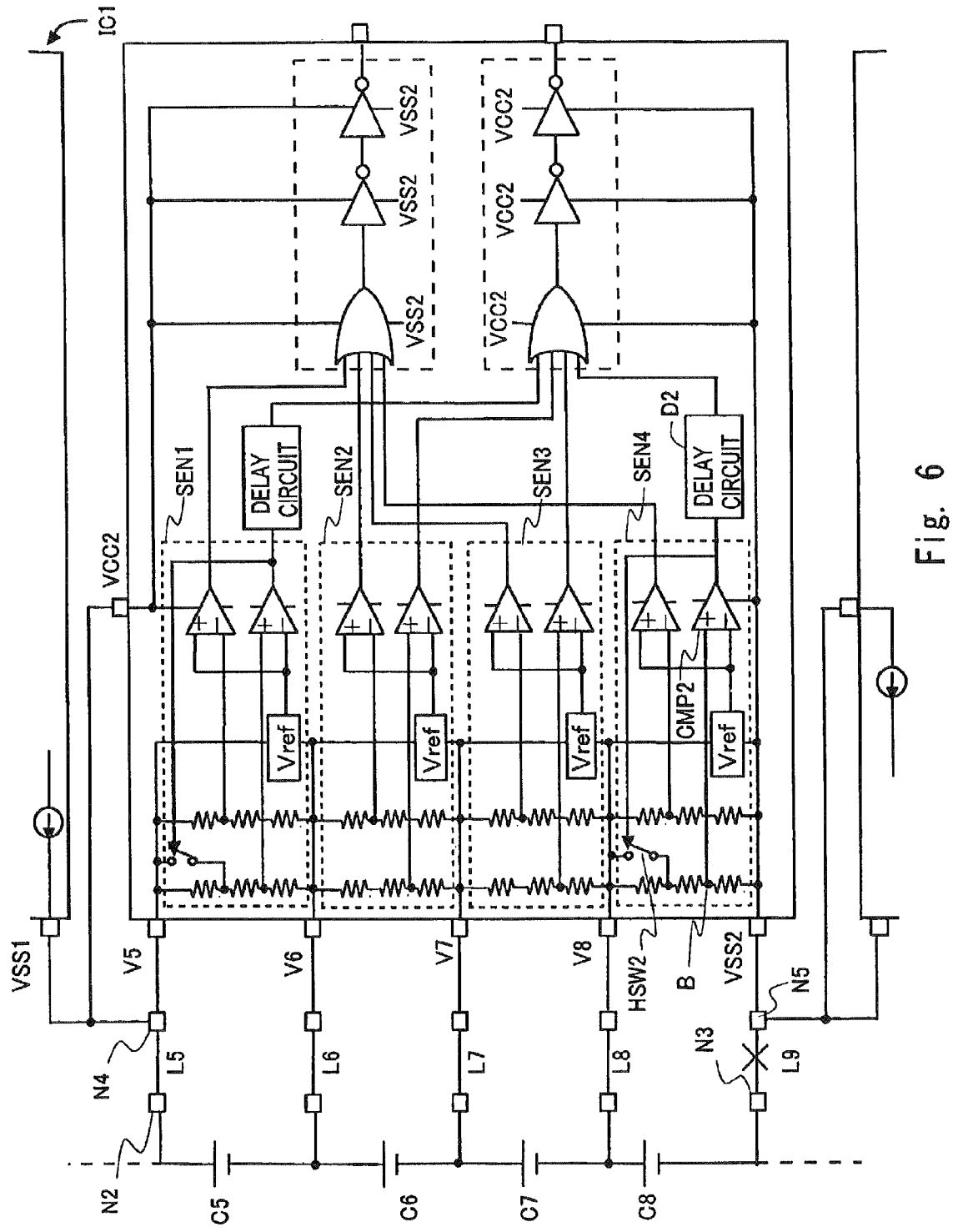
FIG. 6 is a drawing of the voltage monitoring apparatus according to the second embodiment in this invention.

FIG. 6 shows a circuit diagram of IC2 according to the second embodiment. In this embodiment, in addition to the voltage sensor SEN1, a switch for hysteresis HSW2 is provided also in a voltage sensor SEN4. A delay circuit D2 is provided between output of comparator for excess voltage detection CMP2 of a voltage sensor SEN4 and output logic circuit LOG2. For explaining, a part of numbers is omitted. FIG. 6 has the same configuration as the circuit in FIG. 3 except the switch HSW2 and the delay circuit D2.

Figure 7:
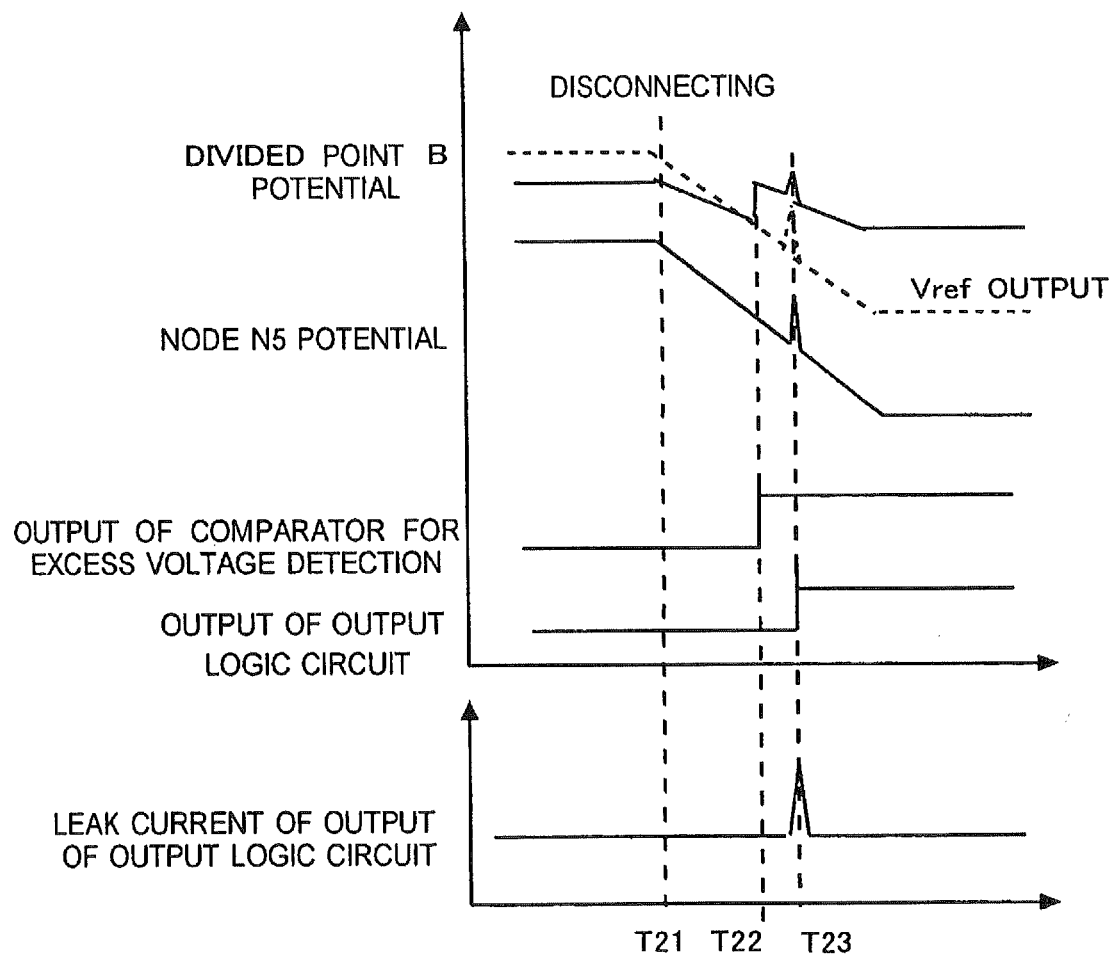
FIG. 7 is an operation waveform of the voltage monitoring apparatus according to the second embodiment in this invention.

In this embodiment, when the comparator for excess voltage detection of voltage sensor SEN4 outputs detection of excess voltage as the first embodiment, the switch for hysteresis HSW2 turns conduction state. FIG. 7 shows a node N5 potential, a divided point B potential, output potential Vref of reference potential circuit VREF, output of comparator for excess voltage detection CMP2 in the voltage sensor SEN4, output of output logic circuit LOG2, and leak current flowing into output logic circuit on the condition that disconnection happens to the line L9 in the voltage monitoring apparatus 20 of the second embodiment.

It is assumed that disconnection is caused in the line L9 in FIG. 6 at the time T21 of FIG. 7. When disconnection is caused in the line L9 at the time T21, the node N5 potential becomes down based on the current source IC3. The reference potential Vref and the divided point B potential fall down according to fall of node N5 potential (terminal VSS2 potential). At this time, falling gradient of node N5 potential has slower pace than the reference potential Vref because of the potential divide resistor R2 (see divided point B potential in FIG. 7). When the divided point B potential becomes higher than Vref at the time T22, output of comparator for excess voltage detection CMP2 becomes high level (see output of comparator for excess voltage detection in FIG. 7).

Because output of comparator for excess voltage detection becomes high level, the switch for hysteresis HSW2 turns conduction state. With the switch for hysteresis HSW2, a part of resistors between the terminal V8 and the divided point B potential is set to be shorted. Hence, the divided point B potential increases at the time T22 (see divided point B potential in FIG. 7).

Output of comparator for excess voltage detection CMP2 is input to the OR circuit of output logic circuit LOG2 through the delay circuit D2. The delay circuit D1 is provided between the comparator for excess voltage detection CMP2 of voltage sensor SEN4 and the output logic circuit LOG2. Hence, the OR circuit of output logic circuit LOG2 outputs high level at the time T23. At the time T23, a certain time is passed from when the comparator for excess voltage detection 24 outputs high level (see output of output logic circuit).

At this time, leak current flows between VCC2 and VSS2 (see leak current of output logic circuit in FIG. 7) and VSS2 and Vref rise. However, in this embodiment, when the comparator for excess voltage detection CMP2 outputs high level at the time T2, the switch for hysterisis HSW2 becomes conduction state. This operation sets the divided point B potential increase. Hence, even if leak current flows into the output logic circuit LOG2, the divided point B potential does not become Vref or below, and output of comparator for excess voltage detection CMP2 does not change (see divided point B potential and output of output logic circuit in FIG. 7).

As described above, this invention can be applied to the voltage sensor SEN4 connected to the line, which is the connect portion between IC2 and lower voltage sensor module (IC3). It can prevent false operation of voltage sensor module.

Variant Embodiment 1

Figure 8:
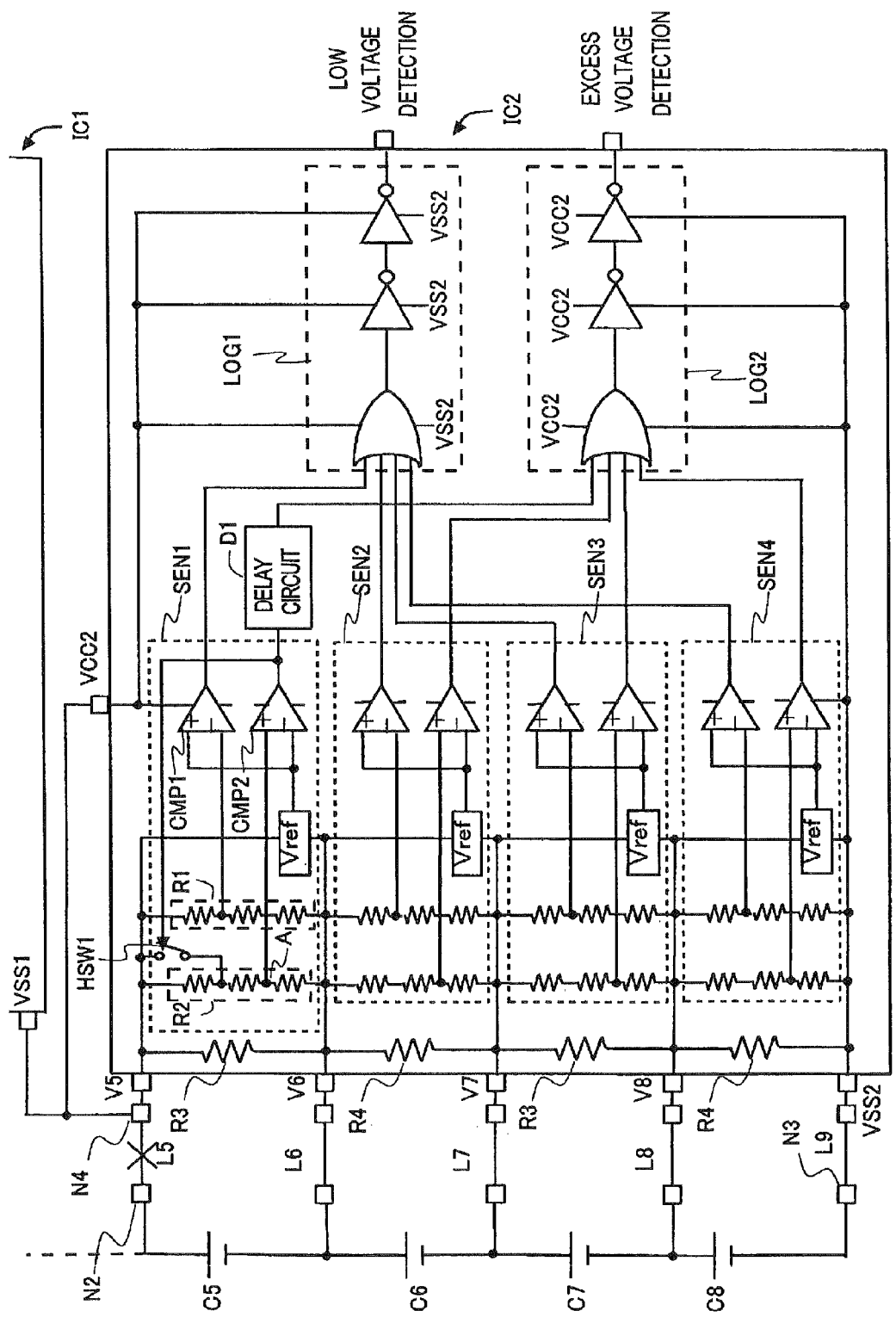
FIG. 8 is a diagram of a variant embodiment of the voltage monitoring apparatus in this invention.

FIG. 8 shows a variant embodiment of voltage monitoring apparatus according to embodiments of this invention. The variant also has function of detecting disconnection. This embodiment differs from the first and the second embodiments in the way of detecting disconnection. In the voltage monitoring apparatus shown in FIG. 8, a resistor is connected between input terminals of voltage sensor. The value of resistor R3 connected between input terminals of voltage sensor SEN1 is different from the value of resistor R4 connected between input terminals of voltage sensor SEN2. The resistors R3 and R4 are connected alternately between input terminals of the other voltage sensors below.

Hereinafter, operation of detecting disconnection in the voltage monitoring apparatus configured as described above is explained. The resistor R4 having low resistance value is connected to a forth voltage sensor which is not shown of IC1. The resistor R3 having high resistance value is connected to the voltage sensor SEN1 in FIG. 8. For example, if disconnection is caused in the line L5, on the condition that resistance value connected to resistors R3 and R4 in parallel is sufficiently large, the node N4 potential becomes the divided potential, divided by resistance ratio of resistors R3 and R4 between potential difference of two battery cells C4 and C5. Therefore, when the resistor value of resistor R3 is larger, the node N4 potential rises and excess voltage is detected.

When excess voltage is detected based on disconnection as described above, setting hysteresis, operation of delay circuit and else for stabilizing output of IC2 is the same as the circuit shown in FIG. 3. Hence, explanation of setting hysteresis, operation of delay circuit and else is omitted.

The case in which potential is detected based on potential change caused by current source is described as above. However, this invention can be also applied to the other case.

Third Embodiment

Figure 9:
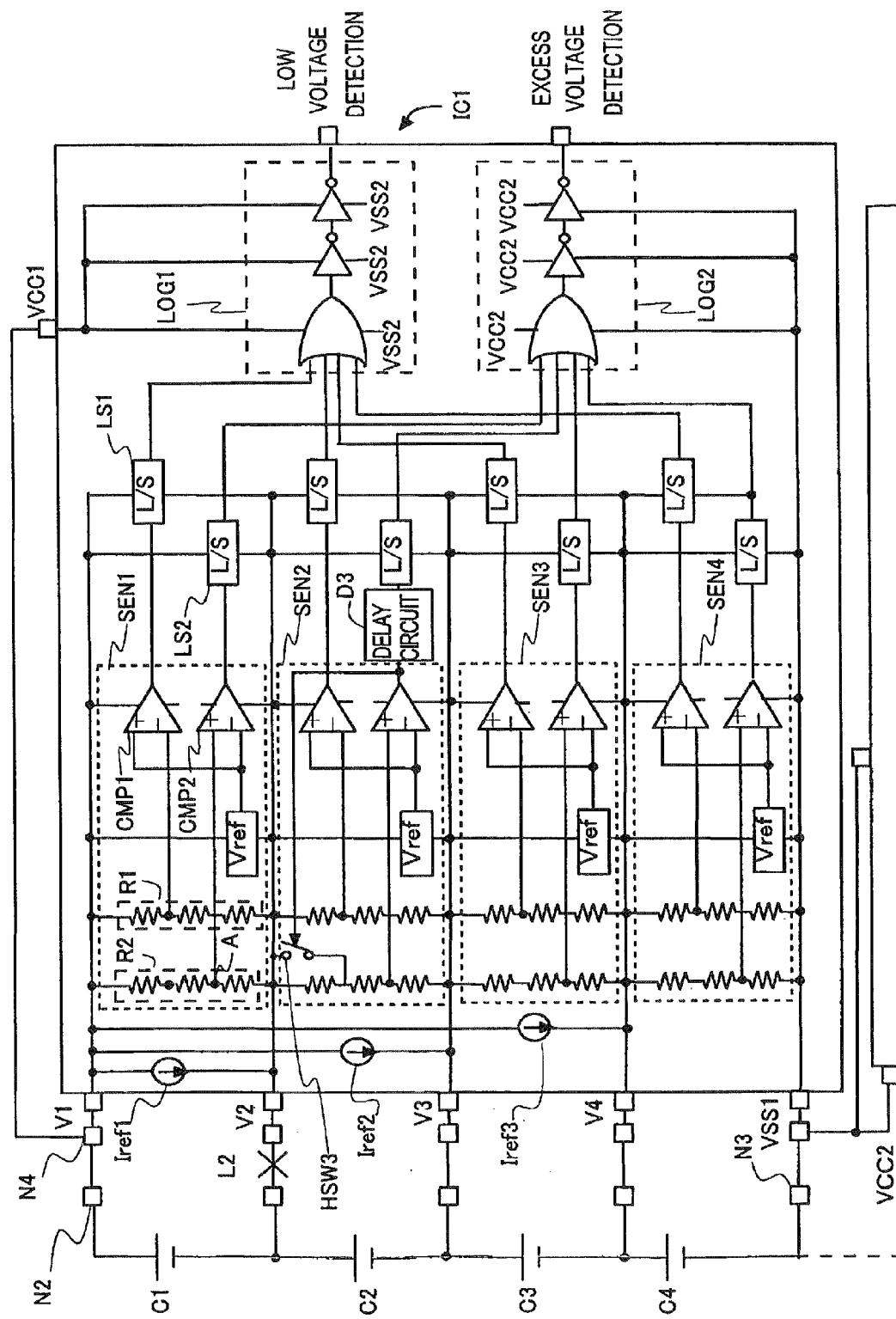
FIG. 9 is a diagram of a voltage monitoring apparatus according to a third embodiment in this invention.

FIG. 9 shows a voltage monitoring apparatus according to a third embodiment. In the first and second embodiments as described above, the case is explained in which the comparator for excess voltage detection CMP2 operates between the potential source VCC2 and VSS2 of voltage sensor module (IC2). On the other hand, in this embodiment, the comparator for excess voltage detection CMP2 and the comparator for low voltage detection CMP1 operate with potential source of one battery cell. FIG. 9 shows the case in which disconnection is caused in the line L2 of voltage monitoring apparatus connected as shown in FIG. 1, for example. In this case, the terminal V2 potential rises with the current source Iref1 and excess voltage is detected.

When the comparators for low voltage detection CMP1 and excess voltage detection CMP2 operate with potential source of one battery cell, outputs of those become the terminal V2 potential at high level, and the terminal V3 potential at low level. However, the output logic circuits LOG1, LOG2, which are connected to output side, operate between VCC1 and VSS1. Output of comparator, operating with potential difference of one battery cell, can not drive the output logic circuit. Hence, in this embodiment, the level shift circuits LS1, LS2, which change potential level for outputs of comparators for low voltage detection CMP1 and excess voltage detection CMP2, are provided in the both comparators.

Hereinafter, leak current of level shift circuit will be described. False operation may be caused by leak current of level shift circuit.

Figure 10:
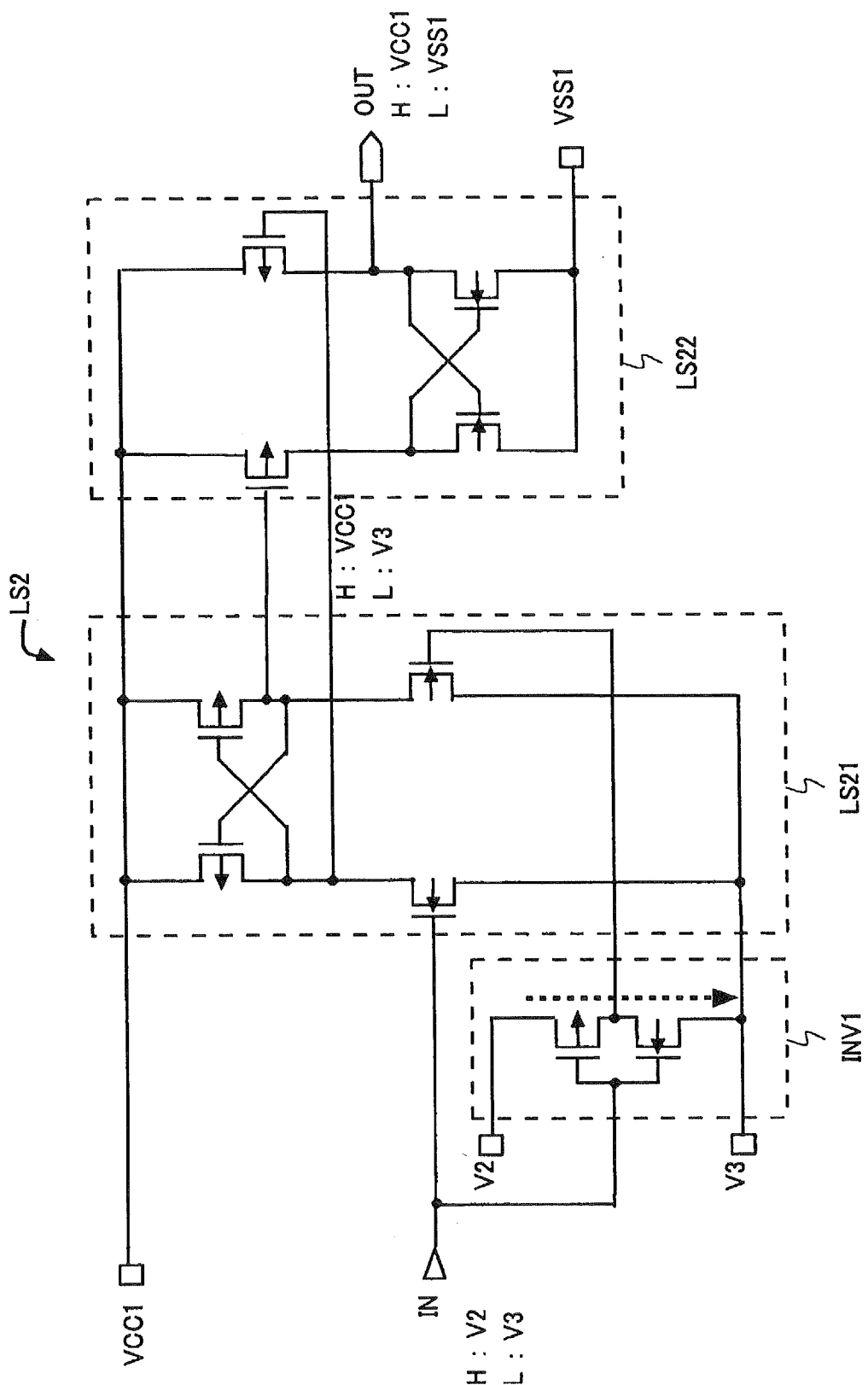
FIG. 10 is a diagram of a level shift circuit according to the third embodiment.
Figure 11:
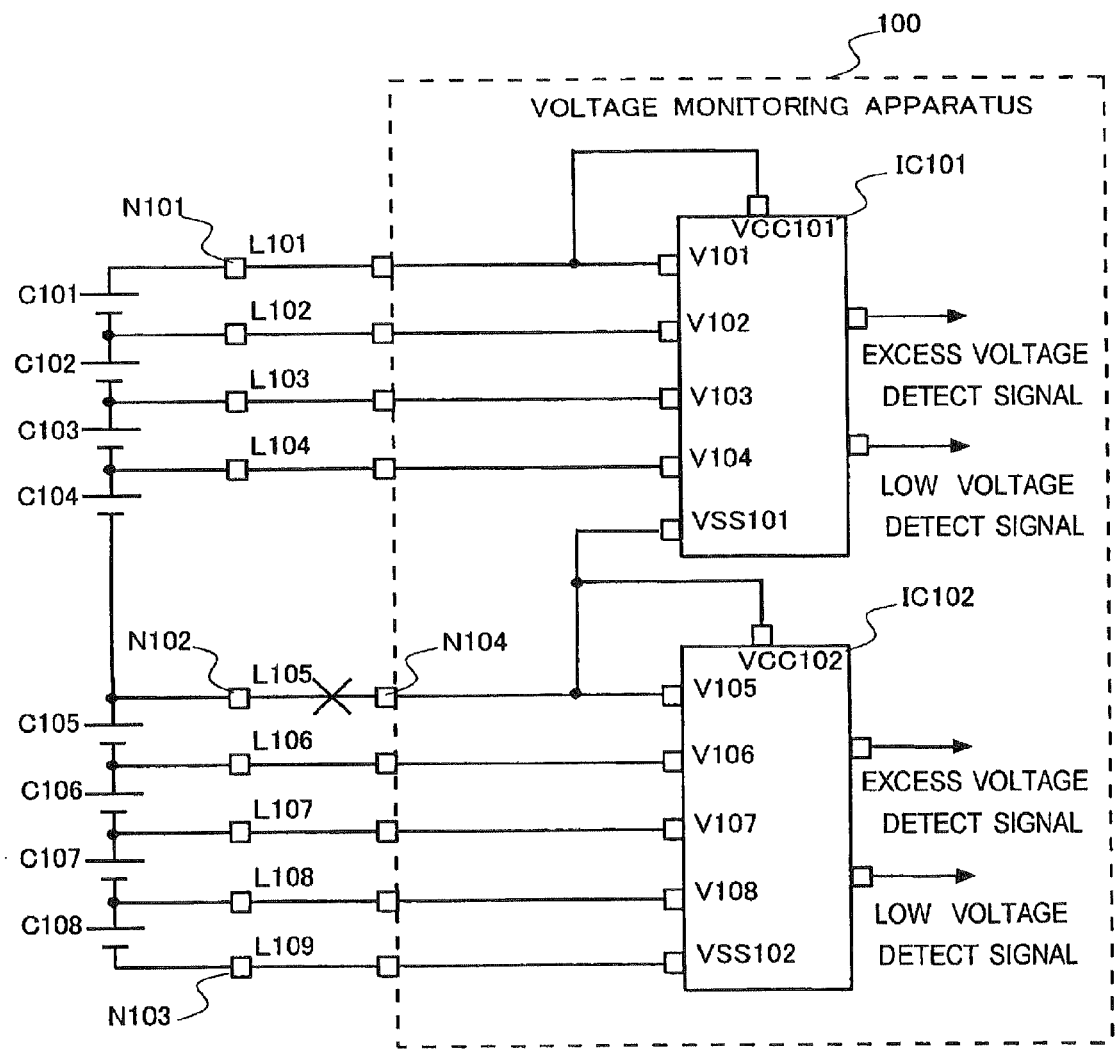
FIG. 11 is a drawing of a conventional voltage monitoring apparatus.
Figure 12:
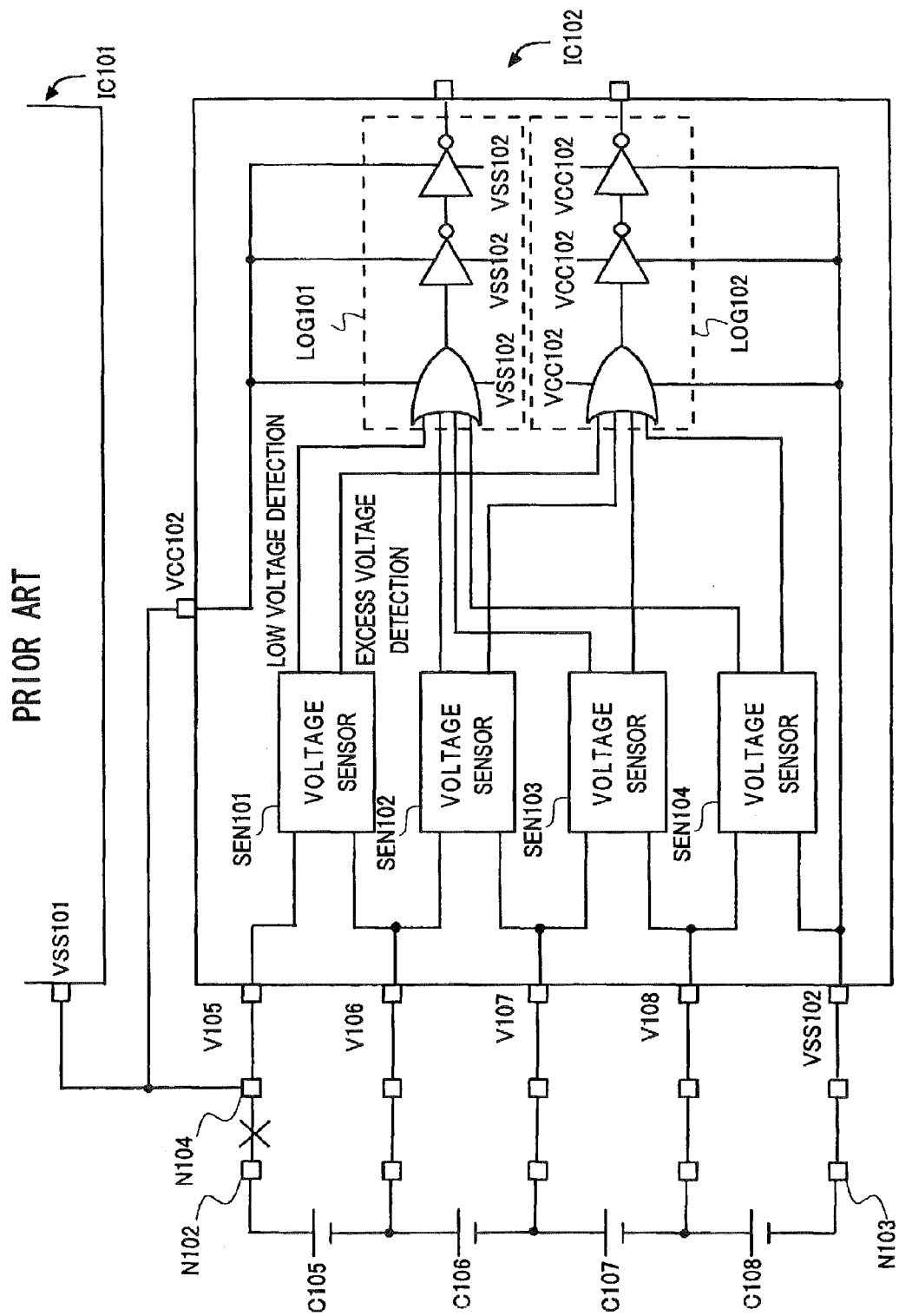
FIG. 12 is a drawing of a conventional voltage monitoring apparatus.

FIG. 10 shows a general level shift circuit. The level shift circuit comprises an inverter INV1, a first level shift circuit $LS2_1$, and a second level shift circuit $LS2_2$. Taking the case in which the level shift circuit is connected between V2 and V3 in FIG. 9 for instance. Leak current flows through the level shift circuit. The comparator outputs a signal of terminal V2 level as high level or a signal of terminal V3 level as low level. Using the inverter INV1 in the level shift circuit LS2, the signal output from the comparator is converted to a pair of complementary signals. The pair of complementary signals is input to the first level shift circuit $LS2_1$. As the inverter INV1 is provided between terminals V2 and V3, output level of inverter INV1 is also terminal V2 level or terminal V3 level. The first level shift circuit $LS2_1$ converts terminal V2 level representing high level into VCC1 level and outputs VCC1 level. At this time, terminal V3 level representing low level is output without being converted. When low level is input to the second level shift circuit $LS2_2$, the second level shift circuit $LS2_2$ converts terminal V3 level representing low level into VSS1 level. In this way, the level shift circuit LS2 converts the signal of terminal V2 level representing high level and the signal of terminal V3 level representing low level into the signal of VCC1 level representing high level and the signal of VSS1 level representing low level and outputs them.

In the level shift circuit as described above, an inversion signal of input signal is generated in the first inverter. Hence, when the inverter inverts the input signal, leak current flows between V2 and V3. This leak current changes terminal V2 potential and terminal V3 potential as leak current does in the other embodiments. As a result, false operation of the comparator for excess voltage detection or else may be caused.

In this embodiment, a switch for hysteresis HSW3 is provided so that a part of voltage divider resistor for excess voltage detection is shorted to terminal V2 side. A delay circuit is provided between the comparator for excess voltage detection CMP2 and the level shift circuit LS2. When the comparator for excess voltage detection CMP2 outputs high level, hysteresis characteristic is given to output signal of the comparator CMP2 with this configuration. After this operation, with outputting high level to the level shift circuit LS2, it can prevent false operation of the voltage monitoring apparatus.

In this embodiment, hysteresis is set for the comparator for excess voltage detection in addition to the situation in which line corresponding to connect portion between ICs is disconnected. And certain delay time is set before the comparator for excess voltage detection outputs signal. Hence, it can prevent false operation of the voltage monitoring apparatus.

In these embodiments described above, configuration of delay circuit is not explained. However, a delay circuit configured with a plurality of series-connected inverters or else is not preferable because leak current flows into these inverters. Hence, it is preferable that the delay circuit using resistance component and capacitor component is applied to these embodiments. However, if the line between output of comparator and input of logic circuit has predefined delay property, this portion can be used as the delay circuit.

In this embodiment, with using the switch for hysteresis, hysteresis is set for the comparator. However, if the comparator itself has hysteresis, advantages of this invention can also be obtained without using the switch for hysteresis. As described above, embodiments of this invention are described in detail, but the configuration can be changed in many ways in this invention. For example, the case is described above in which false operation is caused in at detecting excess voltage, but this invention can also be applied to the operation in detecting low voltage.

It is apparent that the present invention is not limited to the above embodiment, but may be modified and changed without departing from the scope and spirit of the invention.

What is claimed is:

1. A battery voltage monitoring apparatus monitoring an assembled battery voltage, the assembled battery including a plurality of battery cells, the battery voltage monitoring apparatus comprising:
    a plurality of input terminals, the plurality of input terminals being respectively coupled to the plurality of battery cells through a potential measurement line;
    a comparator having a hysteresis characteristic and comprising a first terminal and a second terminal, the second terminal receiving a reference voltage; and
    a current source, one end of the current source being coupled between one of the plurality of the input terminals and the first terminal.

2. The battery voltage monitoring apparatus according to claim 1, further comprising:
    a resistor coupled between one of the plurality of the input terminals and the first terminal; and
    a switch coupled between one of the plurality of the input terminals and the first terminal, the switch being parallel to the resistor,
    wherein a control terminal of the switch is coupled to an output of the comparator.

3. The battery voltage monitoring apparatus according to claim 1, further comprising a plurality of a current sources that include the current source,
    wherein the plurality of the current sources are respectively coupled to the plurality of the input terminals.

4. The battery voltage monitoring apparatus according to claim 1, wherein the assembled battery include a first battery cell, a second battery cell, and a third battery cell,
    wherein the plurality of input terminals includes a first input terminal, a second input terminal, a third input terminal, and a fourth input terminal,
    wherein the first and second input terminals receive a voltage applied between both ends of the first battery cell,
    wherein the second and third input terminals receive a voltage applied between both ends of the second battery cell, and
    wherein the third and fourth input terminals receive a voltage applied between both ends of the third battery cell.

5. The battery voltage monitoring apparatus according to claim 4, wherein the first terminal of the comparator is coupled between the first input terminal and the second input terminal.

6. The battery voltage monitoring apparatus according to claim 5, wherein the comparator comprises a first comparator,
    wherein the battery voltage monitoring apparatus further comprises a second comparator having a hysteresis characteristic and comprising a third terminal and a fourth terminal,
    wherein the third terminal is coupled between the third input terminal and the fourth input terminal, and
    wherein the fourth terminal receives a reference voltage.

7. The battery voltage monitoring apparatus according to claim 4, wherein the comparator comprises:
    a first power supply terminal coupled to the first input terminal; and
    a second power supply terminal coupled to the fourth input terminal.

8. The battery voltage monitoring apparatus according to claim 4, wherein the comparator comprises:
    a first power supply terminal coupled to the first input terminal; and
    a second power supply terminal coupled to the second input terminal.

9. The battery voltage monitoring apparatus according to claim 8, further comprising a level shifter circuit coupled to an output of the comparator.

10. The battery voltage monitoring apparatus according to claim 9, further comprising an output circuit that comprises a third power supply terminal coupled to the first terminal and a fourth power supply terminal coupled to the fourth terminal, the output circuit being connected to an output of the level shifter circuit.

11. The battery voltage monitoring apparatus according to claim 10, further comprising a delay circuit coupled between the comparator and the output circuit.

* * * * *